(12) United States Patent
Seo et al.

(10) Patent No.: US 11,324,149 B2
(45) Date of Patent: *May 3, 2022

(54) THIN ELECTROMAGNETIC SHIELDING SHEET AND ELECTRONIC DEVICE PROVIDED WITH SAME

(71) Applicant: AMOGREENTECH CO., LTD., Gimpo-si (KR)

(72) Inventors: In Yong Seo, Seoul (KR); Ui Young Jeong, Incheon (KR)

(73) Assignee: AMOGREENTECH CO., LTD., Gimpo-si (KR)

( * ) Notice: Subject to any disclaimer, the term of this patent is extended or adjusted under 35 U.S.C. 154(b) by 767 days.

This patent is subject to a terminal disclaimer.

(21) Appl. No.: 16/304,863

(22) PCT Filed: May 23, 2017

(86) PCT No.: PCT/KR2017/005322
§ 371 (c)(1),
(2) Date: Nov. 27, 2018

(87) PCT Pub. No.: WO2017/209429
PCT Pub. Date: Dec. 7, 2017

(65) Prior Publication Data
US 2020/0329592 A1    Oct. 15, 2020

(30) Foreign Application Priority Data
May 30, 2016  (KR) .......... 10-2016-0066566

(51) Int. Cl.
*H05K 9/00* (2006.01)
*B32B 5/26* (2006.01)
(Continued)

(52) U.S. Cl.
CPC .......... *H05K 9/0024* (2013.01); *B32B 5/26* (2013.01); *B32B 5/266* (2021.05); *B32B 7/12* (2013.01);
(Continued)

(58) Field of Classification Search
CPC .. H05K 9/0024; H05K 1/0203; H05K 1/0216; H05K 1/181; H05K 7/2039;
(Continued)

(56) References Cited

U.S. PATENT DOCUMENTS

2015/0086743 A1* 3/2015 Lee .................... B32B 5/26
                                                    428/41.8
2017/0090532 A1* 3/2017 Koukami ............ H05K 1/181

FOREIGN PATENT DOCUMENTS

KR   20110072946   6/2011
KR   20120122954   11/2012
(Continued)

OTHER PUBLICATIONS

[NPL-1] Ryu et al. (KR 10-2014-0147719 A); Dec. 30, 2014 (KIPRIS machine translation to English). (Year: 2014).*
(Continued)

*Primary Examiner* — David Sample
*Assistant Examiner* — Donald M Flores, Jr.
(74) *Attorney, Agent, or Firm* — Cantor Colburn LLP

(57) ABSTRACT

Provided are a thin electromagnetic shielding sheet and an electronic device having the same. The thin electromagnetic shielding sheet includes: a pressure-sensitive adhesive tape including a fiber-accumulating type substrate, formed by accumulation of a plurality of fibers and having a plurality of pores, and a metal coating layer on an outer circumferential surface of each of the plurality of fibers, and electrically conductive adhesive layers formed on both surfaces of the fiber-accumulating type substrate, and made of an elec-
(Continued)

trically conductive adhesive material filled in the plurality of pores and electrically connected by an applied pressure; a metal layer which is adhered to the electrically conductive adhesive layer on one surface of the pressure-sensitive adhesive tape to shield electromagnetic waves; and an insulating layer formed on the metal layer.

12 Claims, 6 Drawing Sheets

(51) Int. Cl.
    *B32B 15/14*     (2006.01)
    *B32B 7/12*     (2006.01)
    *C09J 9/02*     (2006.01)
    *C09J 7/38*     (2018.01)
    *C09J 7/21*     (2018.01)
    *H05K 1/02*     (2006.01)
    *H05K 1/18*     (2006.01)
    *H05K 7/20*     (2006.01)
    *B32B 9/00*     (2006.01)
    *B32B 9/04*     (2006.01)
    *B32B 15/20*     (2006.01)

(52) U.S. Cl.
    CPC .............. *B32B 9/007* (2013.01); *B32B 9/041* (2013.01); *B32B 15/14* (2013.01); *B32B 15/20* (2013.01); *C09J 7/21* (2018.01); *C09J 7/38* (2018.01); *C09J 9/02* (2013.01); *H05K 1/0203* (2013.01); *H05K 1/0216* (2013.01); *H05K 1/181* (2013.01); *H05K 7/2039* (2013.01); *H05K 9/0081* (2013.01); *B32B 2255/02* (2013.01); *B32B 2255/06* (2013.01); *B32B 2255/205* (2013.01); *B32B 2255/28* (2013.01); *B32B 2307/202* (2013.01); *B32B 2307/206* (2013.01); *B32B 2307/212* (2013.01); *B32B 2307/30* (2013.01); *B32B 2457/08* (2013.01); *C09J 2400/163* (2013.01); *Y10T 428/24967* (2015.01)

(58) Field of Classification Search
    CPC ...... H05K 9/0081; B32B 15/20; B32B 9/041; B32B 5/266; B32B 9/007; B32B 7/12; B32B 15/14; B32B 2255/06; B32B 2307/202; B32B 2307/206; B32B 2307/212; B32B 2307/30; B32B 2457/08; C09J 7/21; C09J 7/38; C09J 9/02; C09J 2400/163; Y10T 428/24967
    See application file for complete search history.

(56) References Cited

FOREIGN PATENT DOCUMENTS

| | | | |
|---|---|---|---|
| KR | 20130108921 | | 10/2013 |
| KR | 20140083084 | | 7/2014 |
| KR | 20140083084 | A * | 7/2014 |
| KR | 20140147719 | | 12/2014 |
| KR | 20140147719 | A * | 12/2014 |
| KR | 101501057 | | 3/2015 |
| KR | 101511284 | | 4/2015 |
| KR | 20150061580 | | 6/2015 |
| KR | 20150080436 | | 7/2015 |
| KR | 20150108262 | | 9/2015 |

OTHER PUBLICATIONS

[NPL-2] N.J. Pinto, A.N.R. da Silva, E. Fachini, P. Carrión, R. Furlan, I. Ramos, "Electroless Deposition of Thin Metallic Films on Polymer Fibers Prepared via Electrospinning"; Polymer Preprints, 2003, 44(2), pp. 138-139. (Year: 2003).*
[NPL-3] Cho (KR 10-2014-0083084 A); Jul. 2014 (EPO machine translation to English). (Year: 2014).*
International Search Report—PCT/KR2017/005322 dated Aug. 22, 2017.

* cited by examiner

THIN ELECTROMAGNETIC SHIELDING SHEET AND ELECTRONIC DEVICE PROVIDED WITH SAME

TECHNICAL FIELD

The present disclosure relates to an electromagnetic shielding sheet, and more particularly, to a thin flexible electromagnetic shielding sheet capable of improving the electromagnetic shielding efficiency and having a heat dissipation capability, and an electronic device having the thin electromagnetic shielding sheet.

BACKGROUND ART

In recent years, electronic devices including mobile phones, tablet personal computers (PCs), notebooks, or digital cameras have achieved high-performance and high-function, and thus various components have been implemented therein.

Components incorporated in such electronic devices generate heat and electromagnetic waves when performing high-performance and multi-function. When the electromagnetic waves flow into components or flow out to the outside, a variety of electromagnetic disturbances are generated due to electromagnetic waves from malfunction of other electronic devices to negative effects on the human body.

Therefore, an electromagnetic shielding sheet is essentially used for an electronic device to prevent the electromagnetic waves from affecting the components.

Electromagnetic shielding technology can be divided into a method of shielding external devices by shielding the vicinity of an electromagnetic wave generating source and a method of protecting an electronic device inside a shielding material and protecting the electronic device from an external electromagnetic wave generating source.

At present, various technologies for enhancing electromagnetic shielding are continuously being developed, and it is necessary to develop a technology of an electromagnetic shielding sheet to be adhered or bonded to an electromagnetic wave generating source and to be connected to the ground.

In addition, as electronic devices have become more sophisticated and miniaturized, electronic components mounted therein have been highly integrated. This causes a lot of heat in the electronic components. The generated heat shortens the life of the product, causes malfunction or malfunction, and in extreme cases it may cause explosion or fire.

Korean Patent Application Publication No. 2013-0136386 (Patent Document 1) discloses an electromagnetic shielding sheet including: a substrate which is produced into a nanoweb form by spinning a polymer material into a fiber strand by a spinning method; a conductive metal layer formed on one surface of the substrate and shielding electromagnetic waves; and an adhesive layer formed on the other surface of the substrate.

The adhesive layer of the electromagnetic shielding sheet of Patent Document 1 is formed by accumulating a plurality of fiber strands obtained by spinning an adhesive material. The adhesive layer has only an adhesive function for adhering the electromagnetic shielding sheet to an object. The electromagnetic shielding function cannot be performed due to electrical connection when the electromagnetic shielding sheet is adhered to an object.

DISCLOSURE

Technical Problem

The present disclosure has been made in view of the above-mentioned problems, and it is an object of the present disclosure to provide a thin electromagnetic shielding sheet capable of improving electromagnetic wave shielding efficiency by increasing an electric current carrying capability and an electronic device having the same.

It is another object of the present disclosure to provide a thin electromagnetic shielding sheet having an electromagnetic wave shielding function and a heat dissipating function and an electronic device having the same.

It is another object of the present disclosure to provide a thin electromagnetic shielding sheet which is capable of shielding electromagnetic waves since an electrically conductive adhesive layer of a pressure-sensitive adhesive tape is adhered and electrically connected on a shield can by an applied pressure when the electromagnetic shielding sheet seals an opening of the shield can containing an electromagnetic wave generation unit, and an electronic device having the thin electromagnetic shielding sheet.

Technical Solution

According to an aspect of the present disclosure, there is provided a thin electromagnetic shielding sheet, which includes a pressure-sensitive adhesive tape including a fiber-accumulating type substrate, formed by accumulation of a plurality of fibers and having a plurality of pores, and a metal coating layer on an outer circumferential surface of each of the plurality of fibers, and electrically conductive adhesive layers formed on both surfaces of the fiber-accumulating type substrate, and made of an electrically conductive adhesive material filled in the plurality of pores and electrically connected by an applied pressure; a metal layer which is adhered to one of the electrically conductive adhesive layers on one surface of the pressure-sensitive adhesive tape to shield electromagnetic waves; and an insulating layer formed on the metal layer.

In addition, the thin electromagnetic shielding sheet according to an embodiment may further include a graphite layer that is adhered to the metal layer to dissipate heat transferred to the metal layer.

Here, the insulating layer may be an insulating coating layer formed by coating an insulating material on the metal layer.

Further, the electrically conductive adhesive layers of the pressure-sensitive adhesive tape may be connected to the ground.

The total thickness of the thin electromagnetic shielding sheet may be 50 μm or less.

In addition, the fiber-accumulating type substrate of the pressure-sensitive adhesive tape may be a nanofiber web made of fibers having a diameter of 1 μm or less or a nonwoven fabric web made of fibers having a diameter of more than 1 μm.

The fiber-accumulating type substrate has a structure in which a nanofiber web composed of fibers having a diameter of 1 μm or less is bonded to one surface or both surfaces of a nonwoven fabric web made of fibers having a diameter of more than 1 μm. The nanofiber web may be formed by accumulating fibers of a polymer material obtained by electrospinning on one surface or both surfaces of the nonwoven fabric web, or may be formed by laminating a separately formed nanofiber web on one surface or both surfaces of the nonwoven fabric web.

The electrically conductive adhesive layers may be made of an adhesive material in which an electrically conductive filler is dispersed.

In addition, the diameters of the fibers may be 100 nm to 5 µm.

Further, the metal coating layer may be a multi-layer structure including: a first metal coating layer of Ni coated on an outer circumferential surface of each of the fibers; and a second metal coating layer of Cu coated on an outer circumferential surface of the first metal coating layer of Ni.

Here, the thickness of the metal coating layer may be 0.05 µm to 1 µm.

The sum of the thickness of the fiber-accumulating substrate on which the metal coating layer is formed and the thickness of the electrically conductive adhesive layers, that is, the thickness of the pressure-sensitive adhesive tape may be 30 or less.

An electronic device according to an embodiment may be configured such that the pressure-sensitive adhesive tape of the above-mentioned thin electromagnetic shielding sheet adheres to an electromagnetic wave generator or is adhered near the electromagnetic wave generator.

An electronic device according to an embodiment includes: a printed circuit board; an electromagnetic wave generator mounted on the printed circuit board; a shield can including an insertion hole communicating from an upper side of the shield can to a lower side thereof, the electromagnetic wave generator being embedded in the insertion hole, the lower side of the shield can being coupled to the printed circuit board and being connected to the ground; a liquid thermal interface material (TIM) filled in the insertion hole of the shield can to surround the electromagnetic wave generator; and a thin electromagnetic shielding sheet adhered to the upper side of the shield can, wherein the thin electromagnetic shielding sheet includes: a pressure-sensitive adhesive tape including a fiber-accumulating type substrate, formed by accumulation of a plurality of fibers and having a plurality of pores, and a metal coating layer on an outer circumferential surface of each of the plurality of fibers, and electrically conductive adhesive layers formed on both surfaces of the fiber-accumulating type substrate, and made of an electrically conductive adhesive material filled in the plurality of pores and electrically connected by an applied pressure; a metal layer which is adhered to one of the electrically conductive adhesive layers on one surface of the pressure-sensitive adhesive tape to shield electromagnetic waves; and an insulating layer formed on the metal layer.

In addition, the thin electromagnetic shielding sheet may further include a graphite layer that is adhered to the metal layer to dissipate heat transferred to the metal layer, in the electronic device according to an embodiment, in which case, the insulating layer may be formed in the graphite layer.

In the above-described electronic device, the shield can is connected to the ground, and the electrically conductive adhesive layers of the electromagnetic shielding sheet are adhered to the shield can to electrically connect the electrically conductive adhesive layers and the shield can.

Advantageous Effects

According to the present disclosure, since the pressure-sensitive adhesive tape in which the electrically conductive adhesive layers are formed on the pores and the surface of the fiber-accumulating type substrate excellent in electrical conductivity is included in the thin electromagnetic shielding sheet, there is an advantage that the electromagnetic wave shielding efficiency can be improved with an increase in an electric current carrying capability.

According to the present disclosure, there is an advantage that the electromagnetic wave shielding function and the heat dissipation function can be performed simultaneously by including the graphite layer in the thin electromagnetic shielding sheet.

According to the present disclosure, by implementing an electromagnetic shielding sheet with a thin structure having a thickness of 50 µm or less, there is an effect that electromagnetic waves generated in an electromagnetic wave generator of an electronic device can be efficiently shielded to meet the specifications of the electronic device including an up-to-date portable terminal.

BEST MODE

Hereinafter, embodiments of the present invention will be described in detail with reference to the accompanying drawings.

In some embodiments, a thin electromagnetic shielding sheet is implemented using a pressure-sensitive adhesive tape.

Figure 1:
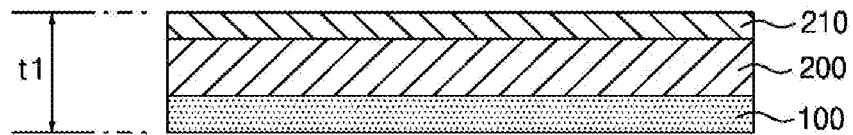
FIG. 1 is a cross-sectional view of a thin electromagnetic shielding sheet according to a first embodiment of the present disclosure.
Figure 3:
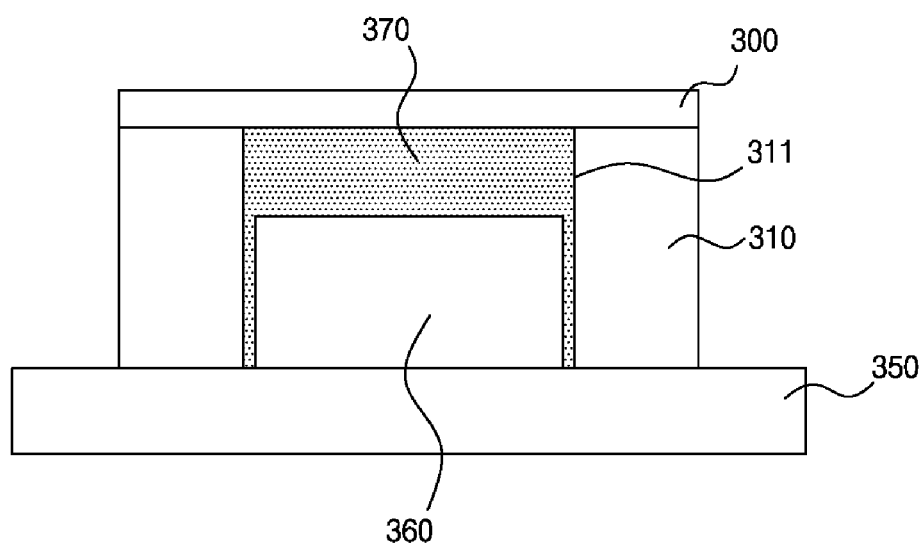
FIG. 3 is a schematic cross-sectional view of an electronic device provided with a thin electromagnetic shielding sheet according to an embodiment of the present disclosure.
Figure 4:
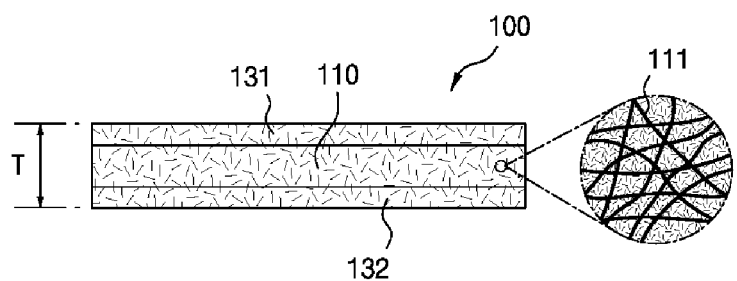
FIG. 4 is a cross-sectional view of a pressure-sensitive adhesive tape according to the present disclosure.

Referring to FIGS. 1, 3, and 4, a thin electromagnetic shielding sheet 300 according to a first embodiment of the present invention includes: a pressure-sensitive adhesive tape 100 including a fiber-accumulating type substrate 110, formed by accumulation of a plurality of fibers and having a plurality of pores, and a metal coating layer on an outer circumferential surface of each of the plurality of fibers, and electrically conductive adhesive layers 131 and 132 formed on both surfaces of the fiber-accumulating type substrate 110, and made of an electrically conductive adhesive material filled in the plurality of pores and electrically connected by an applied pressure; a metal layer 200 which is adhered to the electrically conductive adhesive layer 131 on one surface of the pressure-sensitive adhesive tape 100 to shield electromagnetic waves; and an insulating layer 210 formed on the metal layer 200.

The pressure-sensitive adhesive tape 100 will be described later in detail. However, the pressure-sensitive adhesive tape 100 has the electrically conductive adhesive layers 131 and 132 formed on the pores and the surface in the fiber-accumulating type substrate 110 having excellent electrical conductivity and electrically connected by an applied pressure.

The metal layer 200 is a metal film, and can employ a metal having excellent electrical conductivity. For example, the metal layer 200 is preferably implemented as a Cu film.

The insulating layer 210 is preferably implemented as an insulating coating layer formed by coating an insulating material on the metal layer 200 having excellent flexibility. Alternatively, an insulating film 210 may be attached to the metal layer 200.

The thin electromagnetic shielding sheet according to the first embodiment of the present invention adheres by applying pressure to an electromagnetic wave generator or a neighboring region thereof.

Here, since the pressure-sensitive adhesive tape 100 of the thin electromagnetic shielding sheet is electrically communicated, the electromagnetic waves generated in the electromagnetic wave generator are transmitted to the metal layer 200 through the pressure-sensitive adhesive tape 100, and the metal layer 200 shields the transmitted electromagnetic waves.

When the metal layer 200 and the electrically conductive adhesive layers 131 and 132 of the pressure-sensitive adhesive tape 100 are connected to the ground, the electromagnetic waves flowing to the pressure-sensitive adhesive tape 100 escape to the ground, and the electromagnetic waves transferred to the metal layer 200 are also transmitted to the ground.

As described above, the pressure-sensitive adhesive tape 100 of the thin electromagnetic shielding sheet can shield the electromagnetic waves generated in the electromagnetic wave generating unit 360 or can shield the electromagnetic waves that flow into the electromagnetic wave generator 360 from the outside, as shown in FIG. 3.

In addition, according to the present invention, the thin electromagnetic shielding sheet 300 includes the pressure-sensitive adhesive tape 100 in which the electrically conductive adhesive layers 131 and 132 are formed on the pores and the surfaces in the fiber-accumulating type substrate 110 having excellent electrical conductivity, there is an advantage that the electromagnetic wave shielding efficiency can be improved by the excellent electric current carrying capability.

Figure 2:
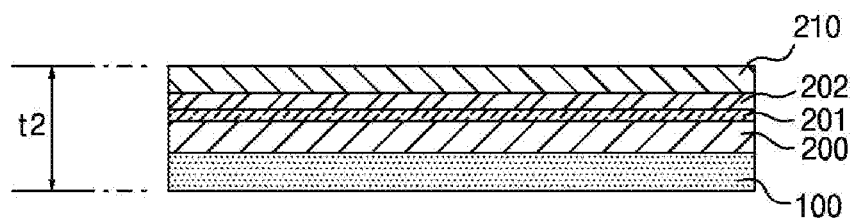
FIG. 2 is a cross-sectional view of a thin electromagnetic shielding sheet according to a second embodiment of the present disclosure.

FIG. 2 is a cross-sectional view of a thin electromagnetic shielding sheet according to a second embodiment of the present invention.

Referring to FIGS. 2 to 4, the thin electromagnetic shielding sheet 300 according to the second embodiment of the present invention includes: a pressure-sensitive adhesive tape 100 including a fiber-accumulating type substrate 110, formed by accumulation of a plurality of fibers 111 and having a plurality of pores, and a metal coating layer on an outer circumferential surface of each of the plurality of fibers, and electrically conductive adhesive layers 131 and 132 formed on both surfaces of the fiber-accumulating type substrate 110, and made of an electrically conductive adhesive material filled in the plurality of pores and electrically connected by an applied pressure; a metal layer 200 which is adhered to the electrically conductive adhesive layer 131 or 132 on one surface of the pressure-sensitive adhesive tape 100 to shield electromagnetic waves; a graphite layer 202 adhered to the metal layer 200 for dissipating heat transferred to the metal layer 200, and an insulating layer 210 formed on the graphite layer 202.

Here, the adhesive layer 201 may be formed on the metal layer 200, and the graphite layer 202 may be adhered to the adhesive layer 201.

Therefore, the thin electromagnetic shielding sheet 300 according to the second embodiment of the present invention is provided with the graphite layer 202, which has the advantage that the transmitted heat can be radiated quickly.

According to the first or second embodiment of the present invention, it is preferable that the total thickness t1 or t2 of the thin electromagnetic shielding sheet 300 is set to be 50 μm or less to realize a thin structure.

As described above, the thin electromagnetic shielding sheet 300 according to the embodiment of the present invention is adhered to the electromagnetic wave generator 360 of the electronic device and near the electromagnetic wave generator to shield electromagnetic waves generated from the electromagnetic wave generator 360.

In other words, as shown in FIG. 3, the electronic device includes a printed circuit board 350; and an electromagnetic wave generator 360 such as an Application Processor (AP) chip, for example, mounted on the printed circuit board 350, Together with a shield can 310, the thin electromagnetic shielding sheet 300 can shield the electromagnetic waves generated in the electromagnetic wave generator 360 or shield the electromagnetic waves that flow into the electromagnetic wave generator 360 from the outside.

Therefore, an electronic device provided with the thin electromagnetic shielding sheet according to the first or second embodiment can be implemented.

An electronic device provided with the thin electromagnetic shielding sheet 300 of the first embodiment includes: a printed circuit board 350; an electromagnetic wave generator 360 mounted on the printed circuit board 350; a shield can 310 including an insertion hole 311 communicating from an upper side of the shield can to a lower side thereof, the electromagnetic wave generator 360 being embedded in the insertion hole 311, the lower side of the shield can 310 being coupled to the printed circuit board 350 and being connected to the ground; a liquid thermal interface material (TIM) 370 filled in the insertion hole 311 of the shield can 310 to surround the electromagnetic wave generator 360; and a thin electromagnetic shielding sheet 300 in which electrically conductive adhesive layers 131 and 132 are adhered to the upper side of the shield can 310, wherein the thin electromagnetic shielding sheet 300 includes: a pressure-sensitive adhesive tape 100 including a fiber-accumulating type substrate 110, formed by accumulation of a plurality of fibers 111 and having a plurality of pores, and a metal coating layer on an outer circumferential surface of each of the plurality of fibers, and the electrically conductive adhesive layers 131 and 132 formed on both surfaces of the fiber-accumulating type substrate 110, and made of an electrically conductive adhesive material filled in the plurality of pores and electrically connected by an applied pressure; a metal layer 200 which is adhered to the electrically conductive adhesive layer 131 or 132 on one surface of the pressure-sensitive adhesive tape 100 to shield electromagnetic waves; and an insulating layer 210 formed on the metal layer 200.

Here, the shield can 310 is formed in a cylindrical shape (alternatively, in a tubular shape) in which an insertion hole for communicating the upper open region and the lower open region is formed, and the shield can 310 can be connected to the ground.

In addition, since the liquid TIM 370 surrounds the electromagnetic wave generator 360, the heat generated by the electromagnetic wave generator 360 is rapidly transmitted to the shield can 310 and the thin electromagnetic shielding sheet 300, and the transmitted heat is rapidly discharged to the outside through the shield can 310 and the thin electromagnetic shielding sheet 300.

The electrically conductive adhesive layers 131 and 132 of the electromagnetic shielding sheet 300 are adhered to the shield can 310 so that the shield can 310 and the electrically conductive adhesive layers 131 and 132 are electrically connected to each other.

Therefore, the electromagnetic waves generated in the electromagnetic wave generator 360 are transmitted to the ground through the electrically conductive adhesive layers 131 and 132 and the shield can 310 which are all electrically connected, or escape to the ground through the electrically conductive adhesive layers 131 and 132 and the shield can 310, after reaching the metal layer 200, to thereby implement an electronic device having excellent electromagnetic wave shielding performance.

In addition, the thin electromagnetic shielding sheet 300 shields electromagnetic waves flowing from the outside, so that the operation of the electromagnetic wave generator 360 is not affected by external electromagnetic waves.

Technical characteristics of the pressure-sensitive adhesive tape applied to the thin electromagnetic shielding sheet according to an embodiment of the present invention will be described below.

Referring to FIG. 4, in the pressure-sensitive adhesive tape 100 according to an embodiment of the present invention, includes: a fiber-accumulating type substrate 110 in which a plurality of fibers 111 are accumulated and a plurality of pores are formed between the plurality of fibers 111; metal coating layers 112 to 114 (see FIGS. 6A and 6B) coated on the outer circumferential surfaces of the plurality of fibers 111 of the fiber-accumulating type substrate 110 to reduce the sizes of the plurality of pores; and electrically conductive adhesive layers 131 and 132 formed on one side or both sides of the fiber accumulation type substrate 110 on which the metal coating layers 112 to 114 are formed and filled in a plurality of pores reduced in size by the metal coating layers 112 to 114, and electrically connected by an applied pressure.

The fiber-accumulating type substrate 110 is a fibrous web sheet formed by accumulating fibers 111, and the fibrous web sheet typically includes a nanofiber web formed of fibers of relatively small diameters of 1 μm or less or a nonwoven fabric web formed of fibers of relatively large diameters greater than 1 μm.

The fiber-accumulating type substrate 110 is formed by accumulating fibers 111 obtained by electrospinning a polymer material. Here, the fibers obtained by electrospinning are dropped and accumulated, and a large number of pores are formed between the fibers.

The metal coating layers 112 to 114 are coating layers of a metal material having excellent electrical conductivity, and Ni, Cu, etc. may be used as the metal. The metal coating layers 112 to 114 can be formed by an electroless plating method.

The electrically conductive adhesive layers 131 and 132 are implemented with an adhesive material in which an electrically conductive filler 136 (see FIG. 5A) is dispersed, and The electrically conductive filler 136 uses at least one of metal powder such as Ni, Cu, and Ag, which is excellent in electrical conductivity, carbon black powder, carbon nanotube powder, and graphene powder.

In some embodiments, metal coating layers 112 to 114 are formed on the outer circumferential surfaces of a plurality of fibers 111 of the fiber-accumulating type substrate 110 to implement the fiber-accumulating type substrate 110 with excellent electrical conductivity and improved flexibility.

In the pressure-sensitive adhesive tape 100 according to an embodiment of the present invention, since the electrically conductive adhesive layers 131 and 132 are formed on the pores and the surface in the fiber-accumulating type substrate 110 having excellent electrical conductivity, the pressure-sensitive adhesive tape 100 is pressurized to increase the electric current-carrying ability when the pressure-sensitive adhesive tape 100 is adhered to an object, thereby increasing the shielding performance.

In addition, in some embodiments, a total sum (T) of the thickness of the fiber-accumulating type substrate 110 on which the metal coating layers 112 to 114 are formed and the thicknesses of the electrically conductive adhesive layers 131 and 132 is preferably 30 μm or less. That is, since the pressure-sensitive adhesive tape 100 can be realized as a thin structure having a thickness of 30 μm or less, there is an advantage that the electromagnetic waves generated in the electromagnetic wave generator 360 of the electronic device can be effectively shielded by satisfying the specification of the electronic device including the latest portable terminal.

In the pressure-sensitive adhesive tape 100 according to an embodiment of the present invention, the metal coating layers 112 to 114 are coated on the outer peripheral surfaces of the plurality of fibers 111 of the fiber-accumulating type substrate 110. In a state in which the fiber-accumulating type substrate 110 has electrical conductivity, the electrically conductive adhesive layers 131 and 132 are formed on one side or both sides of the fiber-accumulating type substrate 110, and the electrically conductive adhesive layers 131 and 132 are filled into the pores of the fiber-accumulating type substrate 110. Accordingly, the pressure-sensitive adhesive tape 100 is adhered to the electromagnetic wave generator 360 such as an AP (application processor) chip or its vicinity by applying pressure, to thereby have an electromagnetic wave shielding function.

Figure 5A:
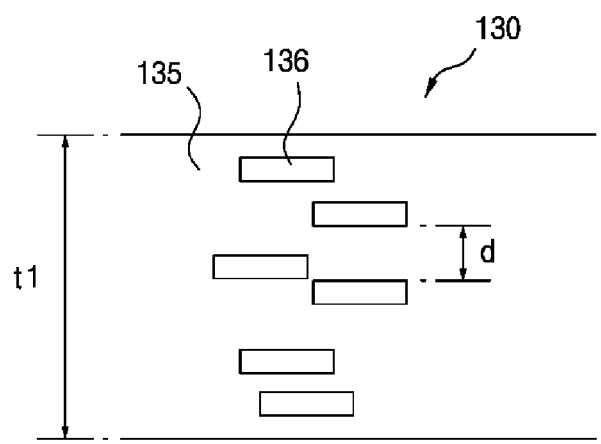
FIGS. 5A and 5B are schematic diagrams for explaining the states before and after pressing of an electrically conductive adhesive layer of a pressure-sensitive adhesive tape according to the present disclosure.
Figure 5B:
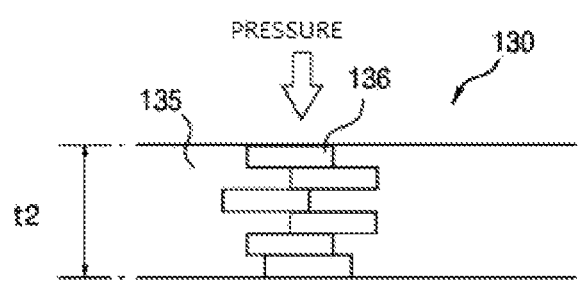

FIGS. 5A and 5B are schematic diagrams for explaining the states before and after pressing of an electrically conductive adhesive layer of a pressure-sensitive adhesive tape according to the present invention.

As shown in FIG. 5A, before the pressure is applied to the pressure-sensitive adhesive tape 100, a plurality of electrically conductive fillers 136 dispersed in the adhesive material layer 135 of the electrically conductive adhesive layer 130 included in the pressure-sensitive adhesive tape 100 are spaced apart from each other by a predetermined distance d. Therefore, electrical conduction due to the mutual connection of the plurality of electrically conductive fillers 136 is not achieved.

As shown in FIG. 5B, in the case that the pressure is applied to the pressure-sensitive adhesive tape 100 to thus make the pressure-sensitive adhesive tape 100 adhered to a target object, the plurality of electrically conductive fillers 136 dispersed in the adhesive material layer 135 of the electrically conductive adhesive layer 130 are pressed by the pressure to contact each other to then be electrically connected with each other.

Here, when the pressure-sensitive adhesive tape 100 is electrically connected to a target object and connected to the ground, the electromagnetic waves generated by the electromagnetic wave generator 360 are absorbed by the pressure-sensitive adhesive tape 100 and emitted through the ground so as to be electrically shielded.

FIGS. 5A and 5B schematically exaggeratedly illustrate the characteristics of the electrically conductive pressure-sensitive adhesive layer 130 included in the pressure-sensitive adhesive tape 100 according to an embodiment of the present invention. In conception, the thickness t2 of the electrically conductive pressure-sensitive adhesive layer 130 after the pressure is applied is slightly reduced into the thickness t1 of the electrically conductive pressure-sensitive adhesive layer 130 before the pressure is applied.

Figure 6A:
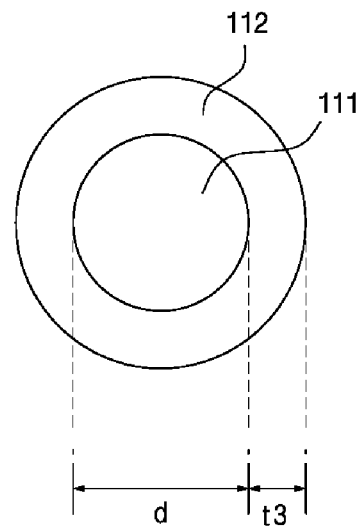
FIGS. 6A and 6B are schematic sectional views for explaining the states in which a metal coating layer is formed on fibers of a fiber-accumulating type substrate of a pressure-sensitive adhesive tape according to the present disclosure.
Figure 6B:
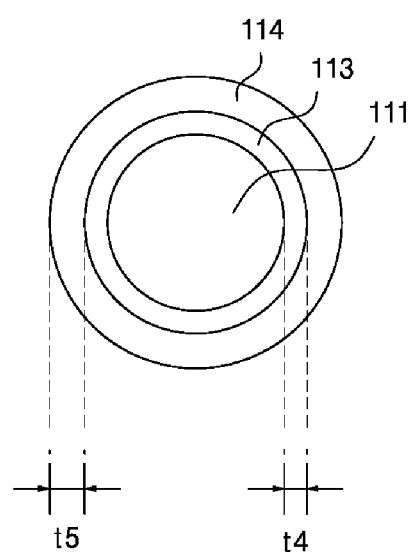

FIGS. 6A and 6B are schematic sectional views for explaining the states in which a metal coating layer is formed on fibers of a fiber-accumulating type substrate of a pressure-sensitive adhesive tape according to the present invention.

Referring to FIG. 6A, a metal coating layer 112 is formed on the outer circumferential surface of the fiber 111 of the fiber-accumulating type substrate, and referring to FIG. 6B, metal coating layers 113 and 134 are formed on the outer circumferential surface of the fiber 111 of the fiber-accumulating type substrate.

Here, fibers of a polymer material are accumulated to form the fiber-accumulating type substrate 110 having electrical insulation characteristics. However, the fiber-accumulating type substrate 110 having the metal coating layer 112 or the metal coating layers 113 and 114 formed on the outer circumferential surface of the fiber 111 has electrical conductivity.

As shown in FIG. 6A, a single-layered metal coating layer 112 may be formed on the outer circumferential surface of the fiber 111. Otherwise, as shown in FIG. 6B, two-layered first and second metal coating layers 113 and 114 may be formed on the outer circumferential surface of the fiber 111.

Referring to FIG. 6B, the first and second metal coating layers 113 and 114 of the two layers are formed to increase the coating property and the electrical conductivity of the fibers 111. First, the first metal coating layer 113 of Ni, such as a seed, can be coated on the outer circumferential surface of the fiber 111, and then the second metal coating layer 114 of Cu which is excellent in electrical conductivity can be coated on the outer circumferential surface of the first metal coating layer 113 of Ni.

The thickness t4 of the first metal coating layer 113 of Ni may be preferably smaller than the thickness t5 of the second metal coating layer 114 of Cu and the thickness t3 of the metal coating layer 112 of the single layer and the thickness t4+t5 of the first and second metal coating layers 113 and 114 of the two layers are preferably in the range of 0.05 μm to 1 μm.

In some embodiments of the present invention, the metal coating layer may be implemented in a multiple-layer structure including: the first metal coating layer 113 of Ni coated on the outer circumferential surface of the fiber 111; and the second metal coating layer 114 of Cu coated on the outer circumferential surface of the first metal coating layer 113 of Ni.

On the one hand, it is preferable that the metal coating layer 112 of the single layer should be formed on the outer circumferential surface of the fiber 111 by electroless plating, or the first metal coating layer 113 of Ni should be coated on the outer circumferential surface of the fiber 111 by electroless plating. On the other hand, it is preferable that the second metal coating layer 114 of Cu having excellent electrical conductivity should be coated on the outer circumferential surface of the first metal coating layer 113 of Ni by electrolytic plating.

It is preferable that the diameter d of the fibers 111 of the fiber-accumulating substrate should be in the range of 100 nm to 5 μm.

Figure 7A:
FIGS. 7A to 7C are cross-sectional views showing modifications of a fiber-accumulating type substrate of a pressure-sensitive adhesive tape according to the present disclosure.
Figure 7B:
Figure 7C:
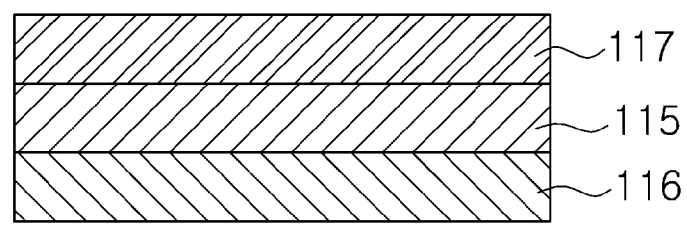

Referring to FIGS. 7A to 7C, The fiber-accumulating type substrate 110 may use a nanofiber web made of fibers of a relatively small diameter in size of 1 μm or less or a nonwoven fabric web 115 made of fibers of a relatively large diameter in size of fibers of more than 1 μm alone (FIG. 7A).

In order to improve the strength of the fiber-accumulating type substrate 110 and to reduce the manufacturing cost thereof, a first nanofiber web 116 formed by accumulating fibers of a polymer material obtained by electrospinning, may be bonded on one surface (FIG. 7B) of a nonwoven fabric web 115 made of fibers of a relatively large-diameter exceeding 1 μm, or first and second nanofiber webs 116 and 117 formed by accumulating fibers of a polymer material obtained by electrospinning, may be respectively bonded on both surfaces (FIG. 7C) of the nonwoven fabric web 115 made of fibers of the relatively large-diameter exceeding 1 μm, or the first nanofiber web 116 made separately may be bonded on one surface (FIG. 7B) of the nonwoven fabric web 115 or first and second nanofiber webs 116 and 117 made separately may be respectively bonded on both surfaces (FIG. 7C) of the nonwoven fabric web 115, thereby forming a laminated structure.

Figure 8:
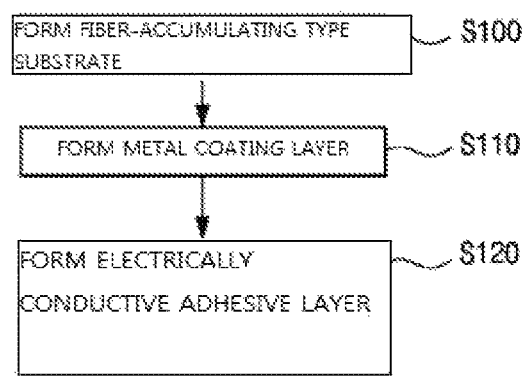
FIG. 8 is a flowchart of a method of producing a pressure-sensitive adhesive tape according to the present disclosure.

Referring to FIGS. 4 and 8, a method of manufacturing a pressure-sensitive adhesive tape according to an embodiment of the present invention will be described below. First, a plurality of fibers 111 are accumulated to form a fiber-accumulating type substrate 110 in which a plurality of pores are formed between the plurality of fibers (S100).

Thereafter, the metal coating layers 112 to 114 (see FIGS. 6A and 6B) are formed (S110) by coating metal on the outer circumferential surfaces of the plurality of fibers 111 of the fiber-accumulating type substrate 110 to reduce the sizes of the plurality of pores.

Then, an electrically conductive adhesive material is filled into a plurality of pores of the fiber-accumulating type substrate 110 on which the metal coating layers 112 to 114 are formed, and is formed on one or both surfaces of the fiber-accumulating type substrate 110, to thereby form the electrically conductive adhesive layers 131 and 132 which can be electrically connected by an applied pressure (S120).

The electrically conductive adhesive layers 131 and 132 can be formed by a method of dip coating, laminating and electrospinning or electrospraying.

Figure 9A:
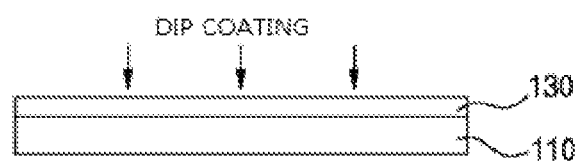
FIGS. 9A to 9C are schematic cross-sectional views for explaining a method of forming an electrically conductive adhesive layer on a fiber-accumulating type substrate of a pressure-sensitive adhesive tape according to the present disclosure.

That is, as shown in FIG. 9A, an electrically conductive adhesive material is dip coated on a fiber-accumulating type substrate 110 having a metal coating layer formed thereon to thereby form an electrically conductive adhesive layer 130.

Figure 9B:
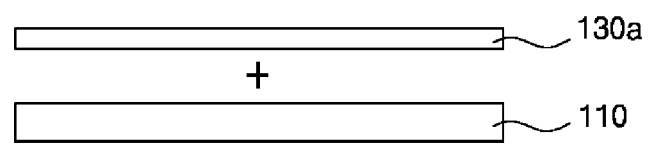

In the laminating method, an electrically conductive adhesive sheet 130a made separately from a fiber-accumulating type substrate 110 on which a metal coating layer is formed is laminated on the fiber-accumulating type substrate 110 on which the metal coating layer is formed (FIG. 9B).

Figure 9C:
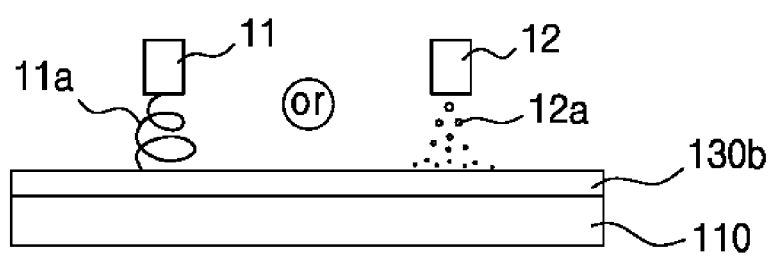

In addition, as shown in FIG. 9C, a spinning solution or a spraying solution containing a mixture of an electrically conductive adhesive material and a solvent is electrospun or electrosprayed through a nozzle 11 or 12, and thus fibers 11a or droplets 12a of an electrically conductive adhesive material are accumulated on a fiber-accumulating type substrate 110 on which a metal coating layer is formed, to thereby form an electrically conductive adhesive layer 130b.

While the present invention has been particularly shown and described with reference to exemplary embodiments thereof, by way of illustration and example only, it is clearly understood that the present invention is not to be construed as limiting the present invention, and various changes and modifications may be made by those skilled in the art within the protective scope of the invention without departing off the spirit of the present invention.

INDUSTRIAL APPLICABILITY

The present invention can be applied to a thin electromagnetic shielding sheet capable of improving electromagnetic wave shielding efficiency with an excellent electrical current carrying capability and having a heat dissipating capability.

What is claimed is:

1. An electromagnetic shielding sheet, comprising:
a pressure-sensitive adhesive tape including: a nonwoven fabric web; a nanofiber web formed on both surfaces of the nonwoven fabric web; and an electrically conductive adhesive layer formed on a surface of the nanofiber web,
wherein the nonwoven fabric web is made of fibers having a diameter of more than 1 μm and includes a plurality of first pores, the nanofiber web is made of nanofibers having a diameter of 1 μm or less, and each of the nanofibers is formed of a nanofiber made of a polymer material and a metal coating layer formed on an outer circumferential surface of the nanofiber, and
wherein the electrically conductive adhesive layer is made of an electrically conductive material, and the electrically conductive material is filled in a plurality of second pores of the nanofiber web;
a metal layer formed on a surface of the pressure-sensitive adhesive tape, the metal layer being configured to shield electromagnetic waves from the electromagnetic wave generator; and
an insulating layer formed on the metal layer.

2. The electromagnetic shielding sheet of claim 1, further comprising: a graphite layer between the metal layer and the insulating layer for dissipating heat transferred to the metal layer.

3. The electromagnetic shielding sheet of claim 1, wherein the insulating layer is an insulating coating layer formed by coating an insulating material on the metal layer.

4. The electromagnetic shielding sheet of claim 1, wherein the electrically conductive adhesive layer is grounded.

5. The electromagnetic shielding sheet of claim 1, wherein the electromagnetic shielding sheet has a thickness of 50 μm or less, and the pressure-sensitive adhesive tape has a thickness of 30 μm or less.

6. The electromagnetic shielding sheet of claim 1, wherein the electrically conductive material is made of an adhesive material and an electrically conductive filler dispersed therein.

7. The electromagnetic shielding sheet of claim 1, wherein the metal coating layer comprises:
a first metal coating layer of Ni coated on the outer circumferential surface of the nanofiber; and
a second metal coating layer of Cu coated on an outer circumferential surface of the first metal coating layer.

8. The electromagnetic shielding sheet of claim 1, wherein the metal coating layer has a thickness of 0.05 μm to 1 μm.

9. An electronic device comprising:
a printed circuit board;
an electromagnetic wave generator mounted on the printed circuit board;
a shield can including an insertion hole communicating from an upper side of the shield can to a lower side thereof, the electromagnetic wave generator being embedded in the insertion hole, the lower side of the shield can being coupled to the printed circuit board and being grounded;
a liquid thermal interface material (TIM) filled in the insertion hole of the shield can to surround the electromagnetic wave generator; and
the electromagnetic shielding sheet of claim 1 adhered to the upper side of the shield can, the electromagnetic shielding sheet comprising:
a pressure-sensitive adhesive tape including: a nonwoven fabric web; a nanofiber web formed on both surfaces of the nonwoven fabric web; and an electrically conductive adhesive layer formed on a surface of the nanofiber web,
wherein the nonwoven fabric web is made of fibers having a diameter of more than 1 μm and includes a plurality of first pores, the nanofiber web is made of nanofibers having a diameter of 1 μm or less, and each of the nanofibers is formed of a nanofiber made of a polymer material and a metal coating layer formed on an outer circumferential surface of the nanofiber, and
wherein the electrically conductive adhesive layer is made of an electrically conductive material, and the electrically conductive material is filled in a plurality of second pores of the nanofiber web;
a metal layer formed on a surface of the pressure-sensitive adhesive tape, the metal layer being configured to shield electromagnetic waves from the electromagnetic wave generator; and
an insulating layer formed on the metal layer.

10. The electronic device of claim 9, wherein the electromagnetic shielding sheet further comprises: a graphite layer between the metal layer and the insulating layer to dissipate heat transferred to the metal layer.

11. The electronic device of claim 9, wherein the shield can is grounded, and the electrically conductive adhesive layer is adhered to the shield can to electrically connect the electrically conductive adhesive layer and the shield can to each other.

12. The electronic device of claim 9, wherein the electrically conductive material is made of an adhesive material and an electrically conductive filler dispersed therein.

* * * * *